(12) United States Patent
Matsumura

(10) Patent No.: US 8,048,254 B2
(45) Date of Patent: Nov. 1, 2011

(54) MOUNTING METHOD

(75) Inventor: Takashi Matsumura, Tochigi (JP)

(73) Assignee: Sony Chemical & Information Device Corporation, Tokyo (JP)

( * ) Notice: Subject to any disclaimer, the term of this patent is extended or adjusted under 35 U.S.C. 154(b) by 53 days.

(21) Appl. No.: 12/194,796

(22) Filed: Aug. 20, 2008

(65) Prior Publication Data
US 2009/0038753 A1 Feb. 12, 2009

Related U.S. Application Data

(63) Continuation of application No. PCT/JP2007/052465, filed on Feb. 13, 2007.

(30) Foreign Application Priority Data

Feb. 23, 2006 (JP) ................................. 2006-046649

(51) Int. Cl.
*B32B 37/10* (2006.01)

(52) U.S. Cl. ....... 156/289; 156/358; 156/60; 156/308.2; 156/580; 156/381; 156/382

(58) Field of Classification Search .................... 156/289
See application file for complete search history.

(56) References Cited

U.S. PATENT DOCUMENTS

| | | | |
|---|---|---|---|
| 3,557,446 A | 1/1971 | Charschan | |
| 4,111,024 A | 9/1978 | Dahlman et al. | |
| 6,179,951 B1 * | 1/2001 | Natarajan et al. | 156/285 |
| 2006/0113356 A1 | 6/2006 | Matsumura et al. | |

FOREIGN PATENT DOCUMENTS

| EP | 1220310 | 7/2002 |
|---|---|---|
| EP | 1646081 | 2/2005 |
| JP | 2002-359264 | 12/2002 |
| JP | 2003-086635 | 3/2003 |
| JP | 2003-86635 | 3/2003 |
| JP | 2003086635 A * | 3/2003 |
| JP | 2003-258413 | 9/2003 |
| JP | 2003258413 A * | 9/2003 |
| JP | 2004-296746 | 10/2004 |
| JP | 2005-032952 | 2/2005 |
| WO | 2005/006430 | 1/2005 |

OTHER PUBLICATIONS

European Office Action issued on Jan. 11, 2010 for corresponding European Patent Application 07708356. Klaka et al., "Reduction of Thermomechanical Stress by applying a Low Temperature Joining Technique," Proceedings of the International Symposium on Power Semiconductor Devices & IC's, Davos, Switzerland, May 31-Jun. 2, 1994, IEEE Cat. No. 94CH3377-9, pp. 259-264.

* cited by examiner

*Primary Examiner* — Philip Tucker
*Assistant Examiner* — Vicki Wu
(74) *Attorney, Agent, or Firm* — K&L Gates LLP

(57) ABSTRACT

A mounting method is provided for mounting electric components on both faces of a substrate. Because the electric components on a front face and a rear face of the substrate are simultaneously pressed with first and second pressing rubbers, the electric components can be connected to the front face and the rear face of the substrate at a time. Because the peripheries of the first and second pressing rubbers are surrounded by a dam member when the first and second pressing rubbers deform, the first and second pressing rubbers are dammed by the dam member and not spread. Thus, positional slip of the electric components does not occur. Because the electric components are connected to the substrate at the same positions as at the time of temporary compression bonding, an electric component having high connection reliability is obtained.

4 Claims, 10 Drawing Sheets ial Application No. PCT/JP2007/052465 filed Feb. 13, 2007,

MOUNTING METHOD

CROSS REFERENCE TO RELATED APPLICATIONS

The present application is a Continuation of International Application No. PCT/JP2007/052465 filed Feb. 13, 2007, which claims priority to Japan Patent Document No. 2006-046649, filed on Feb. 23, 2006, the entire disclosures of which are hereby incorporated by reference in their entireties.

BACKGROUND

The present disclosure relates to a mounting method for mounting electric components on a substrate.

In a mounting step for connecting electric components such as a semiconductor element or the like on the substrate, a compression bonding device in which the electric components are heated, while being pressed to the substrate with a pressing head. A reference numeral 101 of FIG. 14(a) denotes a prior art compression bonding device, and the compression bonding device 101 includes a base 126 and a pressing head 120.

As the pressing head 120, there are a pressing head having a pressing rubber fitted into a metallic frame, a pressing head having a pressing rubber bonded to a metallic plate with an adhesive, a pressing head in which a liquid rubber is flown in a metallic frame and cured therein, etc.

The pressing head having the pressing rubber 122 fitted into the head body 121 made of the metallic frame will be explained. The front face of the pressing rubber 122 is flush with that of the head body 121, or is projected outwardly beneath the front face of the head body 121. When the pressing head 120 is pressed onto an object 110 to be compression bonded, on the base 126, the surface of the pressing rubber 122 is in contact with the object 110 to be compression bonded.

The object 110 to be compression bonded includes a substrate 111 and electric components 116 and 118, which are placed on the substrate 111 and have different thicknesses. A step is formed on the substrate 111 due to a difference in thickness between the electric components 116 and 118.

The pressing rubber 122 is made of an elastic material deformable upon application of a force. The pressing rubber 122 is in first contact with the thickest electric component 116, and is deformed to be in contact from the thicker electric component 116 to the thinner electric component 118 successively, so that the thicker electric component 116 to the thinner electric component 118 are ultimately entirely pressed with the pressing rubber 122 through deformation.

Before the electric components 116, 118 are pressed by the compression bonding device 101, the electric components 116, 118 are aligned with the substrate 111, and terminals of the electric components 116, 118 are located immediately above those of the substrate 111 via an adhesive 115.

The surface of the base 126 is made substantially horizontal, and the substrate 111 is horizontally placed on that surface. When the electric components 116 and 118 are pressed by moving the pressing head 120 vertically downwardly, while the object 110 to be compression bonded is being heated, the electric components 116, 118 move down, pressing away the adhesive 115. Consequently, the terminals of the electric components 116, 118 are in contact with those of the substrate 111, and the electric components 116, 118 are electrically connected to the substrate 111 (FIG. 14(b)). In this way, the conventional compression bonding device 101 can simultaneously connect the electric components having different thicknesses with the single substrate.

Meanwhile, the pressing rubber 122 has the property that when it is deformed on pressing the electric components 116, 118, its peripheral portion swells as a reaction. Thus, the swelled portion of the pressing rubber 122 runs over a frame of the head body 121, and the front face of the pressing rubber 122 spreads horizontally.

FIG. 15 is a plan view showing a state in which the front face of the pressing rubber 122 spreads horizontally, and the pressing rubber 122 flows around the center C of the planar shape in radial directions. As compared with near the center C of the pressing rubber 122, the moving amount of the end portion is greater, so that the electric components 116, 118 to which the end portion of the pressing rubber 122 is pressed, move horizontally with the spreading of the pressing rubber 122, and the terminals of the electric components 116, 118 slip off from the positions immediately above those of the substrate 111.

When the electric components 116, 118 positionally slip, the terminals of the electric components 116, 118 are not in contact with those of the substrate 111, so that the reliability in connection between the electric components 116, 118 and the substrate 111 decreases.

In case that the electric components 116, 118 are to be mounted not only on one face of the substrate 111 but also on the opposite faces, the electric components 116, 118 need to be mounted face by face and in twice, which increases the time required for the mounting.

Furthermore, in case that the electric components 116, 118 are mounted on one face and then the electric components 116, 118 are mounted on the other face, since the surface on which the electric components 116, 118 have been already mounted is faced to the base 126, convex-concave portions need to be formed for the base 126 in conformity with the shapes of the electric components 116, 118 so that the mounted electric components 116, 118 may hardly be damaged with pressing pressure.

However, this method requires bases 126 to be remade every time when the type of electronic parts 116, 118 and substrates 111 or connecting positions of the electric components 116, 118 change.

Further, the electric components 116, 118 having been mounted on one face are heated and pressed again when the electric components 116, 118 are connected to the other face. Thus, electric components 116, 118 are sometimes damaged through repeated heating and pressing. The conventional device is disclosed in JPA 2002-359264 and JPA 2005-32952, for example.

SUMMARY

The present disclosure is directed forward solving the above problems, and is aimed at providing a mounting method capable of assuredly connecting electric components and a substrate.

In an embodiment, a method of mounting an electric component using a compression bonding device having a first and a second pressing plate and a first and a second pressing rubbers placed on the first and second pressing plates, respectively, is provided. The method includes arranging an object to be compression bonded of which electric components are disposed on a front face and rear face of a substrate, between the first and second pressing rubbers, pressing the electric components with the first and second pressing rubbers in order to fix each of the electric components onto the substrate, and includes pressing the object to be compression bonded with the first and second pressing rubbers in the state that a dam member is located at a position higher than surfaces of peripheries of the first and second pressing rubbers, and damming the side faces of the first and second pressing rubbers deformed by the pressing with a dam member.

In an embodiment of the mounting method, the electric components are disposed by adhesion force of anisotropic conductive films arranged on the front face and rear face of the substrate, and the anisotropic conductive films are heated when the electric components are pressed with the first and second pressing rubbers.

In an embodiment of the method of mounting an electric component, before the electric components are pressed with the first and second pressing rubbers, protective films releasable from the anisotropic conductive films are arranged between the first pressing rubber and the object to be compression bonded and between the second pressing rubber and the object to be compression bonded.

In the construction of the embodiment mentioned above, when the first and second pressing rubbers are deformed by pressing their surfaces onto the electric components, the surface portions of the first and second pressing rubbers and spaces above the surfaces of the first and second pressing rubbers are surrounded by the dam member, respectively.

Even if the side faces of the first and second pressing rubbers are deformed to swell, the surface portions of the first and second pressing rubbers are in contact with the dam member directly or via the protective films and do not further swell. On the other hand, even if the surfaces of the first and second pressing rubbers swell up, the swelled portions do not run over the dam member. Consequently, the electric components do not move on pressing, thereby preventing miss-alignment.

In an embodiment, the peripheries of the first and second pressing rubbers may be surrounded by separated dam members, respectively. Alternatively, it may be that only the periphery of the first pressing rubber is surrounded by the dam member such that its tip projects beyond the surface of the first pressing rubber, the second pressing rubber is inserted in a space between the tip of the dam member and the surface of the first pressing rubber, so that the periphery of the second pressing rubber is surrounded by the same dam member as for the first pressing rubber. Further, the peripheries of the first and second pressing rubbers may be simultaneously surrounded by a single dam member.

The first and second pressing rubbers may be surrounded by the dam member or members before the first and second pressing rubbers are deformed, irrespective of before or after the first and second pressing rubbers are in contact with the electric components.

Because the electric components can be simultaneously connected to the front face and the rear face of the substrate, the time period required for the mounting steps can be shortened to decrease the damage upon the electric components through pressing under heating. Since the surface portion of the first or second pressing rubber does not move horizontally, the miss-alignment of the electric components does not occur even on the front face or the rear face of the substrate. Further, when the first or second pressing rubber does not spread horizontally, almost all the deforming forces of the first and second pressing rubbers are converted to forces to press the object to be compression bonded. Thus, waste of the pressing forces can be diminished on pressing.

Additional features and advantages are described herein, and will be apparent from, the following Detailed Description and the figures.

DETAILED DESCRIPTION

Figure 1:
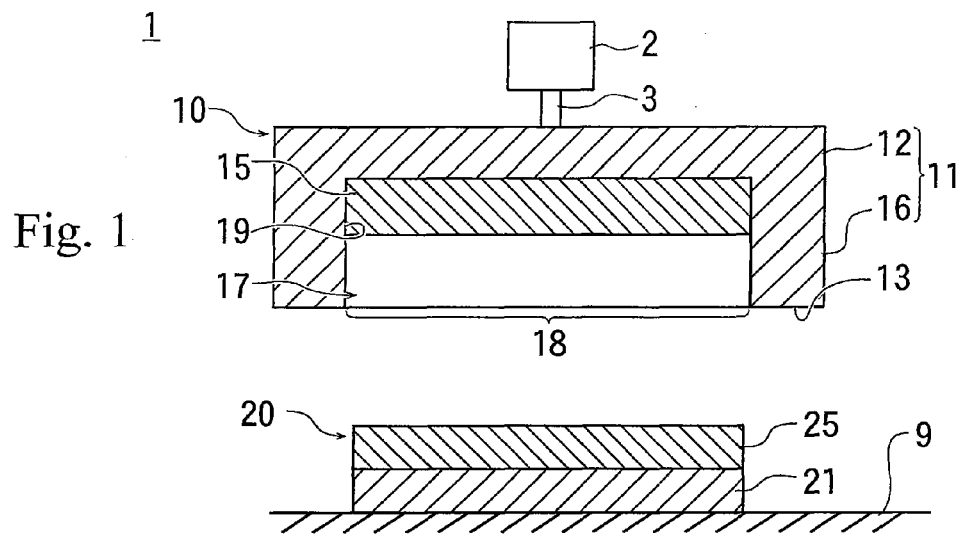
FIG. 1 is a sectional view showing a compression bonding device in a first embodiment.

In FIG. 1, reference numeral 1 denotes one embodiment of a compression bonding device. This compression bonding device 1 includes first and second pressing heads 10, 20, a working table 9 and a driving unit 2. The first pressing head 10 includes a metallic head body 11, a bottom-possessing hole 19 formed in the head body 11, and a first pressing rubber 15 disposed inside the hole 19.

The first pressing rubber has a columnar shape, and the horizontally-cut sectional shape of the first pressing rubber 15 is almost identical with the sectional shape of an area surrounded by a first dam member 16. The bottom face of the pressing rubber is fixedly adhered to that of the hole 19, and the side face thereof is in contact with the side wall of the hole 19.

The height from the bottom face to the surface of the first pressing rubber 15 is set smaller than the depth of the hole 19. The periphery of the first pressing rubber 15 is surrounded by the first dam member 16 formed by the side wall of the hole 19, and a concave portion 17 is formed between the surface of the first pressing rubber 15 and a tip 13 of the first dam member 16. The concave portion has the front face of the first pressing rubber 15 as a bottom face and the first dam member 16 as a side face.

In the first pressing head 10, an opening 18 of the concave portion 17 is directed downwardly and the first pressing rubber 15 is set such that its surface is almost horizontal.

That portion of the first head body 11 which closely adheres to the bottom face of the first pressing rubber 15 is a first pressing plate 12, which is fitted to a driving unit 2 by means of a shaft 3. When the driving unit 2 is actuated to expand or shrink the shaft 3, the first pressing plate 12 perpendicularly moves up and down together with the first pressing rubber 15 and the first dam member 16, while the surface of the first pressing rubber 15 is directed almost horizontally.

The working table 9 is arranged immediately under the first pressing head 10, and a second pressing head 20 is placed on the working table 9.

The second pressing head 20 includes a second head body 21 (second pressing plate) composed of a metallic pressing plate, and a second pressing rubber 25 disposed on a surface of the second head body 21. That face of the second pressing head 20 which is on the side of the second pressing head 21 adhered to the working table 9, while the other face which is on the side of the second pressing rubber 25 is directed upwardly. Therefore, the surface of the second pressing rubber 25 is exposed at an upper face of the second pressing head 20.

Figure 2:
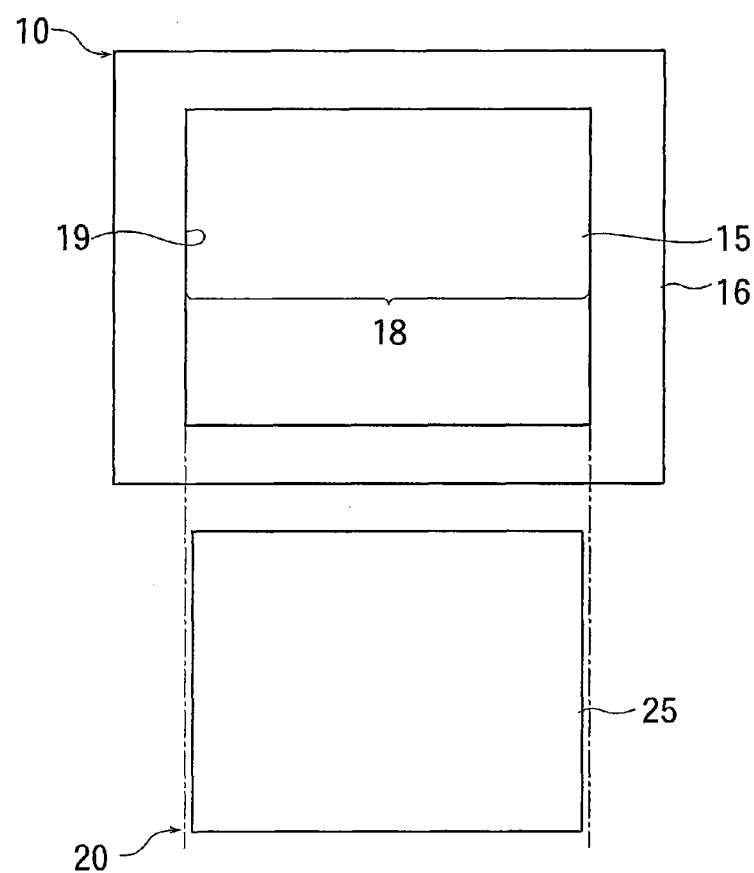
FIG. 2 is a plan view showing shapes of a pressing head and a base.

In this embodiment, nothing is arranged around the periphery of the second pressing rubber 25. The planar shape of the second pressing rubber 25 is made identical with that of the above-mentioned opening 18 of the concave portion 17, or smaller than the latter in a similar shape (FIG. 2). As to the second pressing head 20, at least an upper end of the second pressing rubber 25 is insertable into the concave portion 17.

Next, an object to be compression bonded, which can be compression bonded by this compression bonding device 1 as well as steps for compression bonding the object 30 will be explained.

Figure 4A:
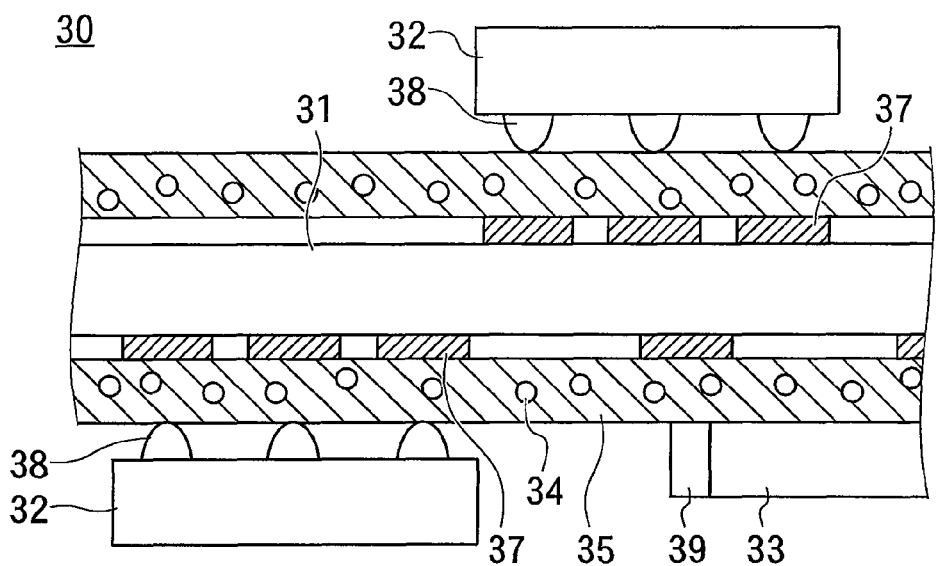
FIGS. 4(a) and 4(b) are enlarged sectional views showing steps of connecting the electric components on the substrate.

In FIG. 4(a), a reference numeral 30 denotes an object to be compression bonded, which includes a substrate 31, anisotropic conductive films 35 and electric components 32, 33.

Terminals 37 are formed at a front face and a rear face of the substrate 31, respectively, and the anisotropic conductive films 35 are arranged on the terminals 37 of the front face of the substrate 31 and on the terminals 37 of the rear face of the substrate 31, respectively.

The electric components 32, 33 have terminals 38, 39 such as bumps, lands or the like. After each of the electric components 32, 33 is aligned to position the terminals 38, 39 above the terminals 37 of the substrate 31, the electric components are individually placed on the anisotropic conductive films 35 by means of a mounting head (not shown). While being heated at a relatively low temperature, the electric components are pressed with small pressure by means of the mounting head, so that they are temporarily bonded to the front face and the rear face of the substrate 31 with bonding force developed by the anisotropic conductive films 35 (temporary compression bonding).

However, since this bonding force is weak, the electric components 32, 33 are likely to separate from the substrate 31 due to a physical impact. Further, the terminal 37 of the substrate 31 is not in contact with those 38, 39 of the electric components 32, 33 physically or mechanically, and the anisotropic conductive films 35 exist between the terminals 37 and those 38 and 39.

The anisotropic conductive films 35 are made larger than the planar shape of the electric components 32, 33, partially run out of the electric components 32, 33 and are exposed between the electric components 32, 33. In addition, even if the anisotropic conductive film 35 is not exposed from the electric components 32, 33, the anisotropic conductive film 35 partially runs out of the outer peripheries of the electric components 32, 33 through pressing at the time of pressing, mentioned later.

Figure 3A:
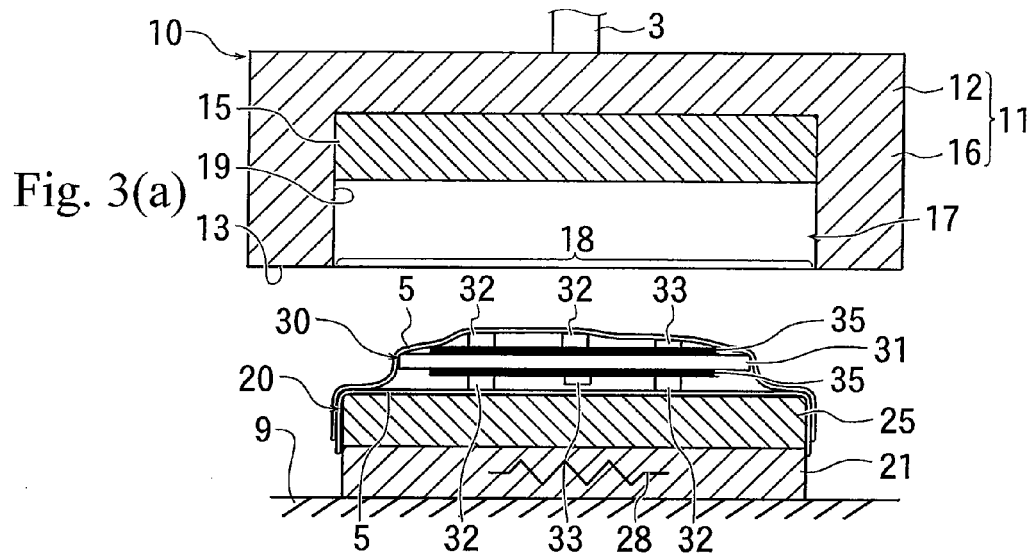
FIGS. 3(a) to 3(c) are sectional views showing steps for mounting electric components on a substrate.

The first and second pressing rubbers 15, 25 are made of a material bondable to the anisotropic conductive films 35. A protective film 5 having a low adhesion to the anisotropic conductive film 35 is arranged on the surface of the second pressing rubber 25 lest the second pressing rubber 25 should be in contact with the anisotropic conductive film 35. Then, the object 30 to be compression bonded is placed on the second pressing rubber 25 in the state that the front face of the substrate 31 is directed upwardly and the rear face of the substrate 31 is directed downwardly (FIG. 3(a)).

Here, the surface of the second pressing rubber 25 is set horizontally, and the thickness of the protective film 5 is made uniform. Therefore, that portion of the surface of the protective film 5 which is positioned on the second pressing rubber 25 is almost horizontal.

Although the electric components 32, 33 having different thicknesses are bonded to the rear face of the substrate 31, plural electric components 32 having the greatest thickness are arranged on the rear face of the substrate 31 with spaces, or a supplementary part is arranged on the second pressing rubber 25 to support the substrate 31. Thus, the substrate 31 is almost horizontally set through being held by the electric components 32 and the supplementary part.

Next, the protective film 5 is also disposed on the object 30 to be compression bonded, lest the first pressing rubber 15 should be in contact with the anisotropic conductive film 35. Thereby, the front face and the rear face of the object 30 to be compression bonded are covered with the protective films 5, respectively.

When the protective film 5 is greater than the planar shape of the second pressing rubber 25 and the protective film 5 on the second pressing rubber 25 or the protective film 5 on the object 30 to be compression bonded hang along the side face of the second pressing rubber 25, the planar shape of the second pressing rubber 25 is made smaller than the opening 18 of the concave portion 17, so that the outer shape of the second pressing rubber 25, including the hanging protective films 5, is almost identical with the size of the opening 18.

The planar shape of the object 30 to be compression bonded is equal to or smaller than that of the second pressing rubber 25, so that the outer periphery of the object 30 is positioned not to run out of the second pressing rubber 25. The directions of the first and second pressing heads 10, 20 are aligned with each other, the outer periphery of the second pressing rubber 25, including the protective films 5, is made in conformity with the opening 18, and the first pressing head 10 is descended, thereby inserting the object 30 into the concave portion 17 of the first pressing head 10.

Assuming that the sum of the thickness of the thickest electric component 32 on the front face of the substrate 31, that of the thickest electric component 32 on the rear face of the substrate 31, and that of the substrate 31 is taken as the thickness of the object 30 to be compression bonded, the depth of the concave portion 17, (i.e. the height of the tip 13 of the first dam member 16 from the surface of the first pressing rubber 15) is equal to or greater than the sum of the thickness of the object 30 and that of the protective films 5 covering the front face and the rear face thereof. Thereby, the object 30 to be compression bonded is entirely received from the front face to the rear face inside the concave portion 17.

When the depth of the concave portion 17 is greater than the sum of the thickness of the object 30 and that of the protective films 5, the first pressing head 10 descends even after the object 30 to be compression bonded is received inside the concave portion 17. However, as mentioned above, since the outer shape of the second pressing rubber 25 including the protective films 5 is almost identical with the size of the opening 18, the tip 13 of the first dam member 16 is not pushed against the surface of the second pressing rubber 25, and the descending of the first pressing head 10 does not stop.

Meanwhile, since the protective film 5 is made of a compression deformable material, and even when the outer shape of the second pressing rubber 25 including the protective films 5 is slightly greater than the opening 18, the protective films 5 enter a gap between the second pressing rubber 25 and the first dam member 16 by the compression deforming, so that the descending of the first pressing head 10 does not stop.

When the descending of the first pressing head 10 is continued, the object 30 to be compression bonded and the first pressing rubber 15 approach relative to each other.

When plural kinds of the electric components 32, 33 having different thicknesses are adhered to the surface of the substrate 31, a step is formed on the surface of the substrate 31 due to the difference in thickness therebetween. Here, since the front face of the first pressing rubber 15 is nearly horizontal and the first pressing head 10 descends along the vertical direction. When the descending of the first pressing head 10 is continued, the surface of the first pressing rubber 15 is in contact with the thickest electric component 32 among the electric components 32, 33 adhered to the front face of the substrate 31 via the protective film 5.

Figure 3B:
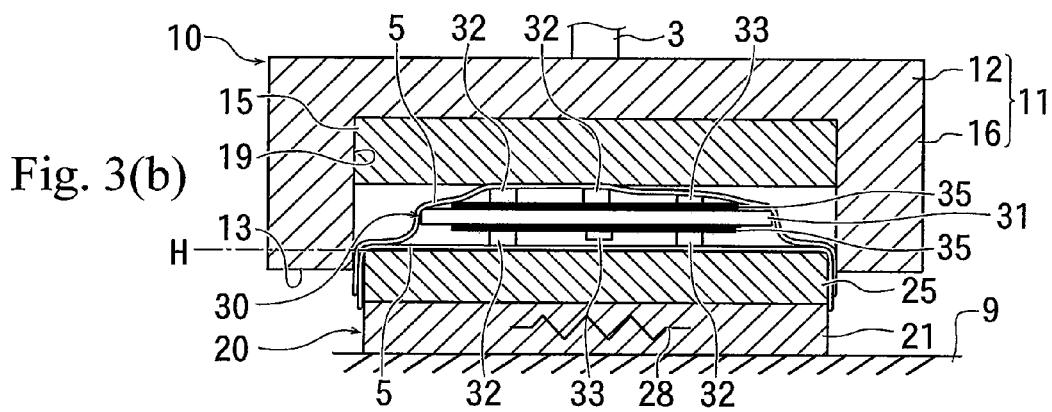

FIG. 3(b) shows the state in which the first pressing rubber 15 is in contact with the thickest electric component 32 only even before it presses each of the electric components 32, 33 on the front face of the substrate 31. Since the depth of the concave portion 17 is equal to or greater than the thickness of the object 30 to be compression bonded including the protective films 5, the tip 13 of the first dam member 16 is located flush with or downwardly from the plane H at which the surface of the second pressing rubber 25 is positioned, in the state that the first pressing rubber 15 is in contact with the thickest electric component 32.

The first and second pressing rubbers 15, 25 are made of an elastic material (for example, an elastomer), which is deformed upon application of force and restores their original shapes upon removal of the force. Although the side face of the first pressing rubber 15 is in contact with the inner wall of the hole 19, it is not fixed to that inner wall. Further, since nothing is arranged around the second pressing rubber 25, not only the central portions but also the peripheral portions of the first and second pressing rubbers 15, 25 are deformable.

Therefore, when the object 30 to be compression bonded is pressed with the first and second pressing rubbers 15, 25 by descending the first pressing head 10 from the state shown in FIG. 3(b), those portions of the first and second pressing rubbers 15, 25 which are in contact with the electric components 32 are dented irrespective of the peripheral portion and the central portion.

When the first and second pressing rubbers 15, 25 are approached relatively to each other by further descending the first pressing head 10, from the thicker electric components 32 to the thinner electric components 33 are successively pressed to the first and second pressing rubbers 15, 25. Ultimately, all the electric components 32, 33 are pressed toward the substrate 31.

Figure 3C:
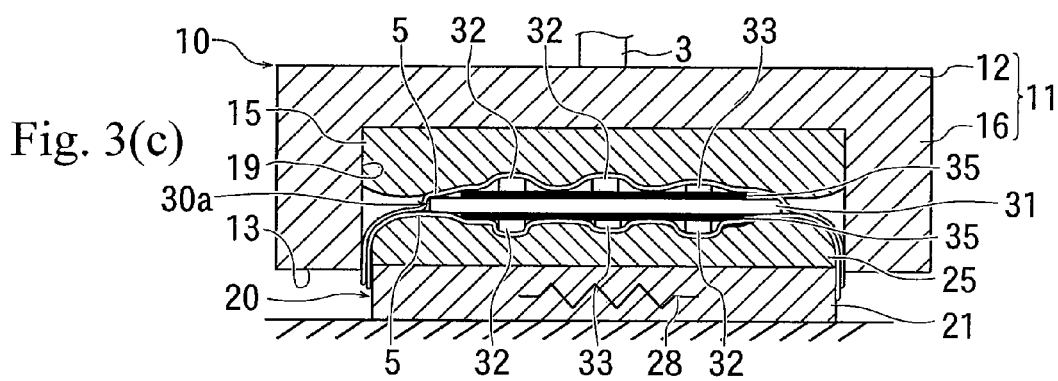

The first and second pressing rubbers 15, 25 are made of the material that is deformed at a portion to which force is applied and swells at the other portion as an elastic material having internal uniform property. That portion of the first pressing rubber 15 which is not in contact with the electric components 32, 33 swells downwardly, while that portion of the second pressing rubber 25 which is not in contact with the electric components 32, 33 swells upwardly (FIG. 3(c)).

Because the first and second pressing rubbers 15, 25 approach each other more than before the deformation, even when the surface of the second pressing rubber 25 is flush with the tip 13 of the first dam member 16 before the deformation, at least the surface portion of the second pressing rubber 25 is received in the concave portion 17 after the deformation, and the side face of that portion received in the concave portion 17 is surrounded by the first dam portion 16.

That side face is in close contact with the first dam member 16. Moreover, if a gap exists between that side face and the first dam member 16, the gap is so narrow that the downwardly swelled first pressing rubber 15 does not flow out.

Therefore, that portion of the first pressing rubber 15 which swells downwardly does not spread horizontally through being dammed by the first dam member 16, and that portion of the side face of the second pressing rubber 25 which is received in the concave portion 17 does not swell any more through being dammed by the first dam member 16.

Since the gap between the side face of the second pressing rubber 25 and the first dam member 16 is narrow, the swelling of that portion of the side face of the second pressing rubber 25 which is received in the concave portion 17 is negligible.

In this way, although the first and second pressing rubbers 15, 25 swell to fill depressions between the electric components 32, 33, the surface portion of the first or second pressing rubbers 15, 25 does not swell in the horizontal direction. That is, in a direction orthogonal to the pressing direction.

Therefore, no force having the direction orthogonal to the pressing direction is applied to the electric components 32, 33, so that the miss-alignment of the electric components 32, 33 does not occur. Thus, the electric components 32, 33 are pressed upon the anisotropic conductive films 35 at the same places as at the time of the temporary compression bonding.

In this embodiment, a heater 28 is built in the second head body 21, the object 30 to be compression bonded is heated to a given temperature by applying current to the heater 28, and the flowability of the anisotropic conductive film 35 is increased by heating.

Figure 4B:
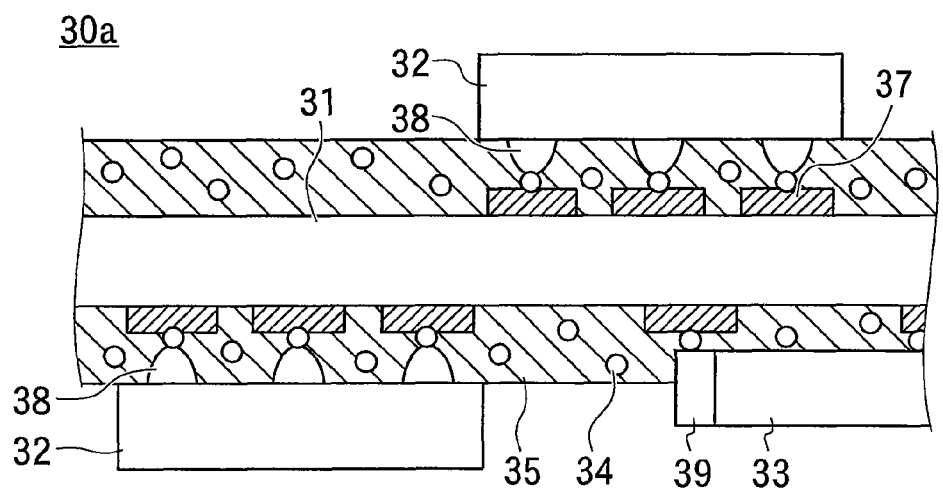

Therefore, when the electric components 32, 33 are pressed upon the anisotropic conductive film 35, the anisotropic conductive film 35 is pushed aside, and the terminals of the electric components 32, 33 get into the anisotropic conductive film 35 (FIG. 4(b)).

Conductive particles 34 are dispersed in the anisotropic conductive film 35, and when the anisotropic conductive film 35 is pushed aside, the terminals 38, 39 of the electric components 32, 33 are in contact with the terminals 37 of the substrate 31 via the conductive particles 34. Thereby, the electric components 32, 33 are electrically connected to the substrate 31.

When the anisotropic conductive film 35 includes a thermosetting resin, the anisotropic conductive film 35 is cured by heating, whereas when the anisotropic conductive film 35 includes a thermoplastic resin, the anisotropic conductive film 35 is solidified as the temperature decreases after the heating.

Therefore, the electric components 32, 33 are mechanically fixed to the substrate 31 through the cured or solidified anisotropic conductive film 35, thereby obtaining an electric device 30a.

If the electric components 32, 33 are positionally slipped on pressing them, the reliability of the electric device 30a lowers, because the terminals 38, 39 of the electric components 32, 33 would not be in contact with the terminals 37 of the substrate 31. However, when the compression bonding device 1 of the present embodiment is used, positional slip of the electric components 32, 33 does not occur as mentioned above. Thus, the electric device 30a having high reliability is obtained.

Since the protective films 5 are positioned between the first pressing rubber 15 and the object 30 to be compression bonded, and between the second pressing rubber 25 and the object 30 to be compression bonded, the first or second pressing rubber 15, 25 is not directly in contact with the anisotropic conductive film 35, even if the anisotropic conductive films 35 run over the outer peripheries of the electric components 32, 33 when the electric components 32, 33 are pressed.

Therefore, the first or second pressing rubber 15, 25 is not bonded to the anisotropic conductive film 35, and the first pressing rubber 15 is separated from the electric device 30a, when the first pressing head 10 is moved upwardly. Then, when the electric device 30a is lifted, the device 30a is separated from the second pressing rubber 25. Thereby, the electric device 30a can be taken out from the compression bonding device 1.

As mentioned above, explanation has been made of the case where the object 30 to be compression bonded is received in the concave portion 17 preliminarily formed in the first pressing head 10 and then the first pressing rubber 15 is in contact with the object 30. However, the present embodiment is not limited thereto.

Figure 5A:
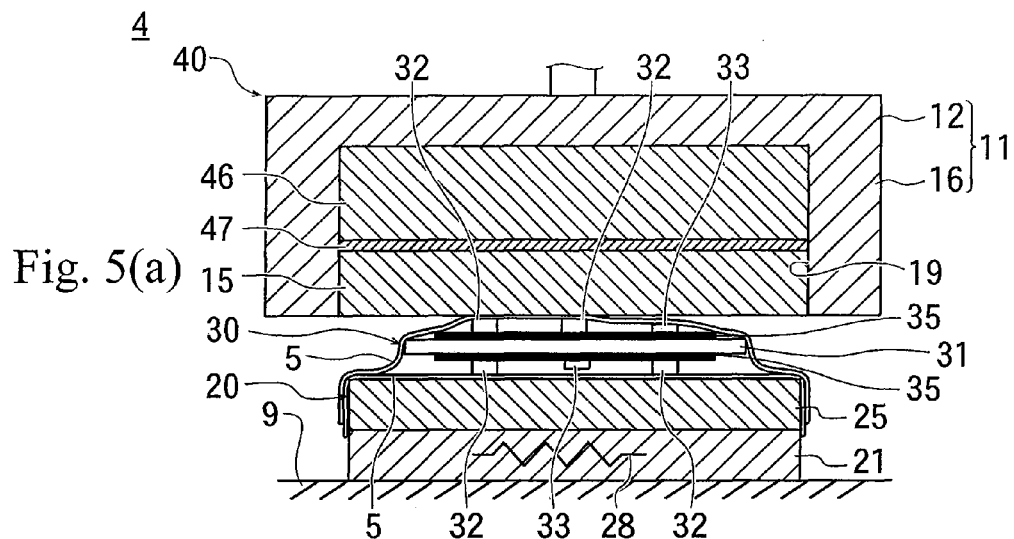
FIGS. 5(a) to 5(c) are sectional views showing steps for mounting electric components onto a substrate by using a compression bonding device in a second embodiment.

In FIG. 5(a), a reference numeral 4 shows a second embodiment of a compression bonding device. This compression bonding device 4 has the same construction as that of the first embodiment of the compression bonding device 1, except that a first compression member 46 is arranged between the first pressing rubber 15 and the first pressing plate 12. The first and second pressing heads 10, 20 are arranged in the same manner.

While the first pressing rubber 15 is made of the internally uniform elastic material as mentioned above, the first compression member 46 is made of a material, which possesses voids therein like a spongy rubber and decreases the volume when the voids are crushed upon application of force.

A movable plate 47 is disposed between the first pressing rubber 15 and the first compression member 46, the upper end of the first compression member 46 is fitted to the surface of the first pressing plate 12 and the lower end of the first compression member 46 is fitted to the front face of the movable plate 47, and the upper end of the first pressing rubber 15 is fitted to the rear face of the movable plate 47. Therefore, the first compression member 46, the movable plate 47 and the first pressing rubber 15 are arranged from the first pressing plate 12 vertically and downwardly in this order.

Similar to the first pressing rubber 15, the first pressing rubber 46 has a columnar shape and the horizontally cut sectional shape of the first compression rubber 46 is identical with the sectional shape of the area surround by the first dam member 16, and the side face of the first compression member 46 is in contact with the first dam member 16.

However, the side face of the first compression member 46 is not fixed to the first dam member 16, and the first pressing rubber 15 or the movable plate 47 is not fixed to the first dam member 16, either. Therefore, as the thickness of the first compression member 46 changes, the first pressing rubber 15 and the movable plate 47 can move within the area surrounded by the first dam member 16.

In order to produce an electric device by using this compression bonding device 4, similarly to the use of the first embodiment of the compression bonding device 1, an object 30 to be compression bonded is arranged on the second pressing rubber 25, and the first pressing rubber 15 is contacted with the thickest electric component 32 through the protective film 5.

The force required for deforming the first compression member 46 is smaller than that for deforming the first and second pressing rubbers 15, 25. Thus, when the first pressing plate 12 is pressed to the first compression member 46 by further descending the first pressing head 10, the first compression member 46 is compressed to decrease its thickness before the first and second pressing rubbers 15, 25 are deformed.

As mentioned above, since the first pressing rubber 15 is made movable inside the area surrounded by the first dam member 16, the first pressing rubber 15 moves upwardly as the thickness of the first compression member 46 decreases, so that a depression which has not been present before the first compression member 46 is compressed, appears and the object 30 to be compression bonded is received in that depression. Since the deforming amount of the first compression member 46 is limited, the compression stops when the first compression member 46 is deformed to some extent.

Figure 5B:
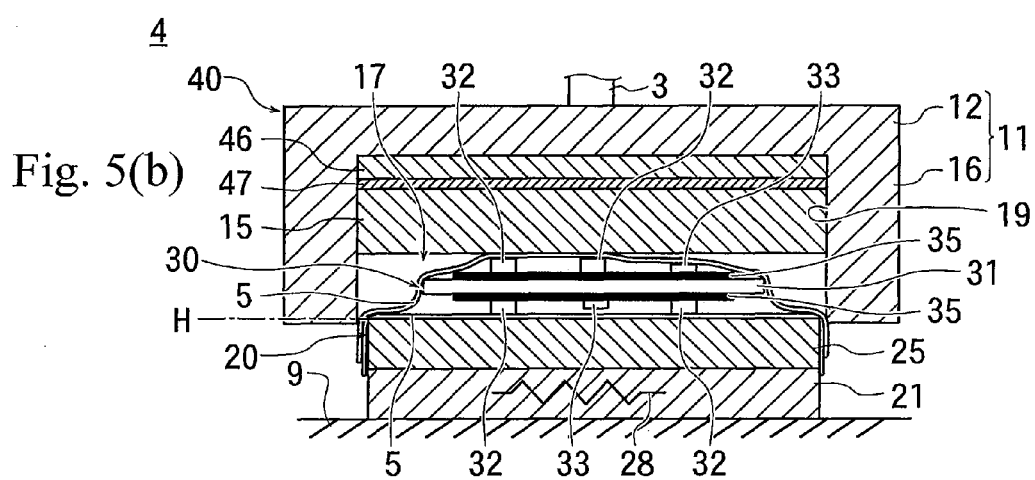
Figure 5C:
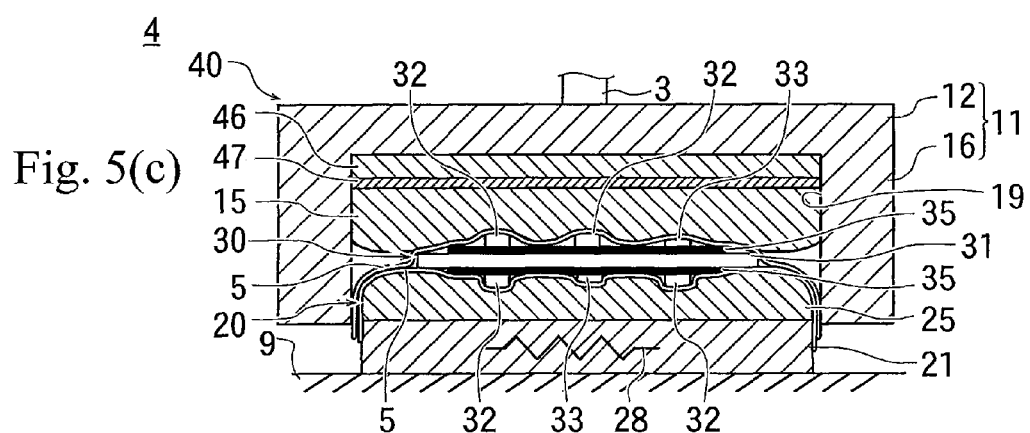

FIG. 5(b) shows a state that the compression of the first compression member 46 is stopped (i.e., the state before the first and second pressing rubbers 15, 25 are deformed). In this state, the tip 13 of the first dam member 16 is projected downwardly from the front face of the first pressing rubber 15 in an amount by which the first pressing rubber 15 moves upwardly, and that tip 13 is flush with or projected downwardly from the flat face H at which the front face of the second pressing rubber 25 is positioned.

Even after the deformation of the first compression member 46 stops, the first and second pressing rubbers 15, 25 are pressed upon and deformed with the electric components 32, 33 when the first pressing head 10 is further descended, whereas those portions of the first and second pressing rubbers that are not in contact with the electric components 32, 33 swell. However, similar to the first embodiment of the compression bonding device 1, the surface portions of the first pressing rubber 15 and the second pressing rubber 25 are surrounded by the first dam member 16, and the space between the second pressing rubber 25 and the first dam member 16 is small, so that the surface of the first pressing rubber 15 does not horizontally spread.

Further, since at least the surface portion of the second pressing rubber 25 is received in the concave portion 17 by the deformation of the first and second pressing rubbers 15, 25, the second pressing rubber 25 does not horizontally spread, even when the surface thereof swells upward. Therefore, in this compression bonding device 4, the electric component 32, 33 does not horizontally move, so that the electric device 30a having high reliability is obtained.

Figure 6:
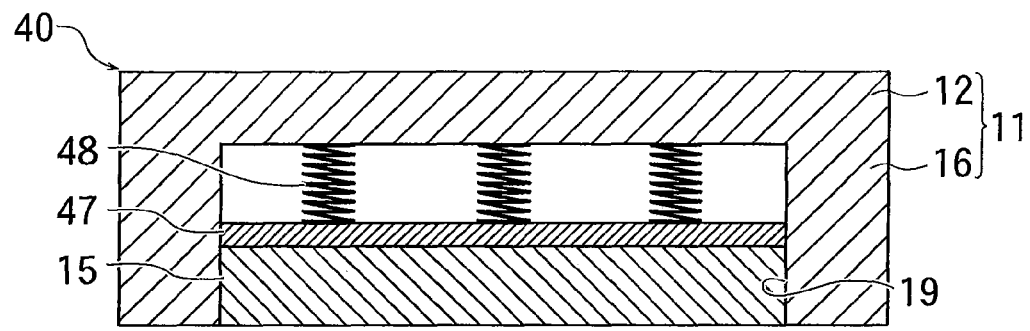
FIG. 6 is a sectional view showing a sectional view of another example of a compassion member.

The first compression member 46 is not particularly limited, as long as its volume is decreased by pressing. As shown in FIG. 6, the compression member may be constituted by springs 48. When the springs 48 are shrunk by pressing with the first pressing plate 12, the surface of the first pressing rubber 15 rises to form a depression. Further, if the force applied to the first pressing rubber 15 is transmitted to the first compression member 46, the movable plate 47 does not necessarily need to be provided.

As mentioned above, the first pressing plate 12 is attached to the shaft 3 of the driving unit 2, and the first and second pressing rubbers 15, 25 are approached relatively to each other by moving the first pressing head 10. However, the present embodiment is not limited thereto. So long as the first and second pressing rubbers 15, 25 are movable relative to each other, the second pressing head 20 may be moved in the state that the first pressing head 10 is stationary. Alternatively, the first and second pressing heads 10, 20 may be both moved.

As mentioned above, explanation has been made of the case where the object 30 to be compression bonded is placed on the surface of the second pressing rubber 25, and then the first pressing head 10 is descended. However, the embodiment is not limited thereto.

In an embodiment, the surface of the second pressing head 20 on a side of which the second pressing rubber 25 is disposed, is directed and arranged downwardly, the first pressing head 10 is disposed at a position under the second pressing head 20, while the surface in which the concave portion 17 is formed is directed and arranged upwardly, the object 30 to be compression bonded is arranged on the bottom face of the concave portion 17. That is on the surface of the first pressing rubber 15, either one or both of the first and second pressing heads 10, 20 are moved to approach the first and second pressing rubbers 15, 25 relative to each other, and the surface of the second pressing rubber 25 is pressed upon the object 30 to be compression bonded.

It is not necessary that the direction of the surfaces of the first and second pressing rubbers 15, 25 be horizontal. For example, the first and second pressing heads 10, 20 may be arranged such that the surfaces of the first and second pressing rubbers 15, 25 are substantially perpendicular.

The moving directions of the first and second pressing heads 10, 20 are not particularly limited. However, in order to prevent the positional slip of the electric components 32, 33, the pressing heads preferably move almost perpendicularly to the front face and the rear face of the substrate 31. Therefore, when the substrate 31 is in parallel to the surfaces of the first and second pressing rubbers 15, 25, the moving directions of the first and second pressing heads 10, 20 are almost vertical to the surfaces of the first and second pressing rubbers 15, 25.

As mentioned above, explanation has been made of the case where nothing exists around the second pressing rubber 25, and its side face is exposed. However, the present embodiment is not limited thereto. For example, the side face of the second pressing rubber 25 may be covered with a thin plate (slide plate) so that the second pressing rubber 25 is not rubbed with the first dam member 16.

When the side face of the second pressing rubber 25 is covered with the slide plate and that second pressing head 20 is received in the concave portion 17, the slide plate is closely fitted to the first dam member 16. Moreover, if there is a gap between the slide plate and the first dam member 16, the gap is made too narrow to flow out the swelled first pressing rubber 15. Thus, the first pressing rubber 15 does not spread horizontally.

Because the slide plate has a small film thickness and even when it is deformed together with the second pressing rubber 25, the deformation of the slide plate stops when it is in contact with the first dam member 16. Because the gap between the first dam member 16 and the slide plate is small before the deformation, and the deformation amount is small, the horizontal spreading of the second pressing rubber 25 is ignorably small.

Even if the edge portion of the surface of the second pressing rubber 25 swells to run over the slide plate, the horizontal spreading of that portion running over the slide plate is small because the thickness of the slide plate is small and the gap between the slide plate and the first dam member 16 is narrow, as mentioned above.

In this way, the first or second pressing rubber 15, 25 does not spread horizontally, or even if they spread horizontally, the spread amount is negligible. Thus, the positional slip of the electric components 32, 33 hardly occur.

In the first and second embodiments of the compression bonding devices 1 and 4, if the gap between the first dam member 16 and the second pressing rubber 25 is large, the gap is buried with the protective films 5 by covering the side face of the second pressing rubber 25 with the protective films 5.

Therefore, even if first and second dam members 16 are made of an inexpensive material at a low cost without using a mold and the forming precision thereof is low, the gap between the dam member 16 and the second pressing rubber 25 is buried by appropriately selecting the thickness of the protective film 5, so that the first pressing rubber 15 does not flow out through the gap.

As mentioned above, explanation has been made of the case where only the first pressing head 10 is provided with the dam member, but the embodiment is not limited thereto.

Figure 7:
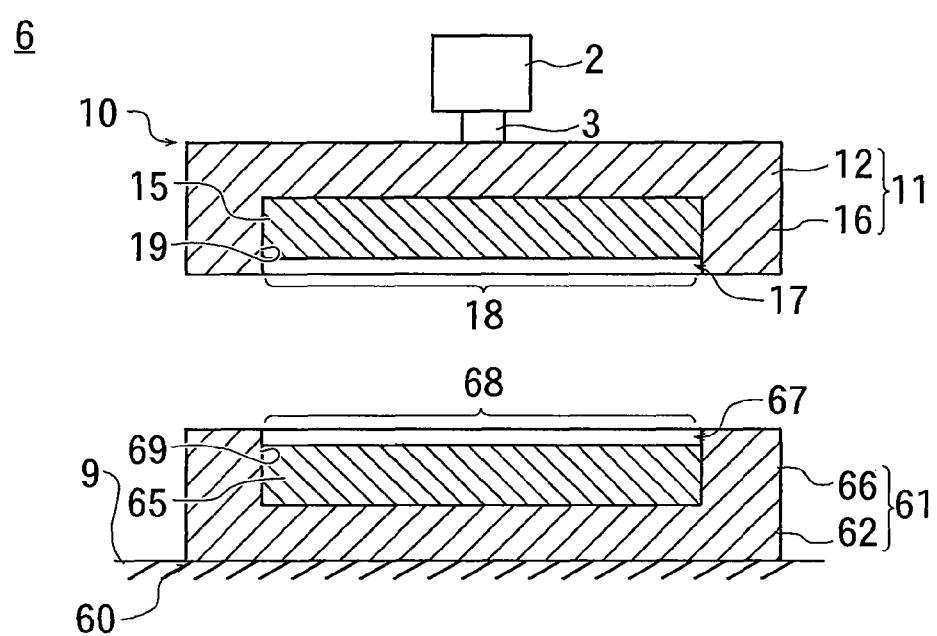
FIG. 7 is a sectional view showing a compression bonding device in a third embodiment.

In FIG. 7, a reference numeral 6 denotes a third embodiment of the compression bonding device. This compression bonding device 6 includes first and second pressing heads 10, 60. The first and second pressing heads 10, 60 comprise first and second head bodies 11, 61 and first and second pressing rubbers 15, 65.

Similar to the pressing head 10 of the first embodiment of the compression bonding device 1, the first and second head bodies 11, 61 are formed with bottom-possessing holes (first and second holes) 19, 69, respectively.

The arrangement of the first and second pressing rubbers 15, 65 is the same as that of the first pressing rubber 15 in the first embodiment of the compression bonding device 1. The first and second pressing rubbers 15, 65 are surrounded by first and second dam members 16, 66 constituted by side walls of the first and second holes 19, 69. First and second concave portions 17, 67 are formed, which possess surfaces of the first and second pressing rubbers 15, 65 as bottom faces and the first and second dam members 16, 66 as side faces, respectively.

The shapes of openings 18, 68 of the first and second holes 19, 69 are almost identical. When the first and second pressing heads 10, 60 are pressed to each other in the state that the edges of the openings 18, 68 are coincidentally aligned with each other, the tips of the first and second dam members 16, 66 are in contact with each other.

Here, the arrangement of the first pressing head 10 and its connection to the driving unit 2 are the same as in the case of the first driving head 10 in the first embodiment of the compression bonding device 1. The first pressing head 10 is upwardly and downwardly movable vertically to the working table 9 by means of the driving unit 2, while the surface of the first pressing rubber 15 is being directed horizontally.

The second pressing head 60 is disposed on the working table 9, while the opening 68 of the second concave portion 67 is directed upwardly, and the surface of the second pressing rubber 65 which constitutes the bottom face of the second concave portion 67 is made almost horizontally, and its surface is a face on which the object 30 to be compression bonded is placed.

Figure 8A:
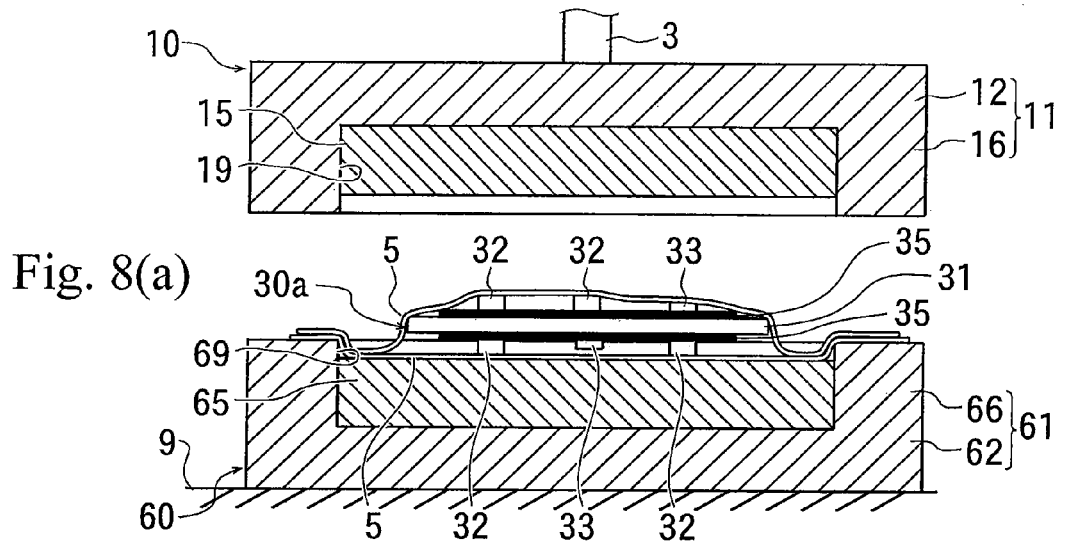
FIGS. 8(a) to 8(c) are sectional views showing steps of mounting electric components on a substrate.

A case where the above-mentioned object 30 to be compression bonded is connected by using this compression bonding device 6 will be explained. In order to prevent the first and second pressing rubbers 15, 65 from being in contact with anisotropic conductive films 35, after the protective film 5 is placed on the surface of the second pressing rubber 65, the object 30 to be compression bonded is disposed on the second pressing rubber 65, while a front face of the substrate 31 is directed upwardly and a rear face of the substrate 31 is directed downwardly, and a protective film 5 is further placed on the front face of the object 30 to be compression bonded (FIG. 8(*a*)).

The sum of the depths of the first and second concave portions 17, 67, that is, the sum of the height from the surface of the first pressing rubber 15 to the tip of the first dam member 16 and the height from the surface of the second pressing rubber 65 to the tip of the second dam member 66 is set smaller than the sum of the thickness of the object 30 to be compression bonded and the thicknesses of the protective films 5 covering the front and rear face thereof.

Therefore, when the object 30 to be compression bonded is placed on the protective film 5 on the mounting face and the first pressing head 10 is descended after the edges of the openings 18, 68 are aligned, the surface of the first pressing rubber 15 is in contact with the object 30 to be compression bonded, through the protective film 5 before the tips of the first and second dam members 16, 66 are in contact with each other.

Figure 8B:
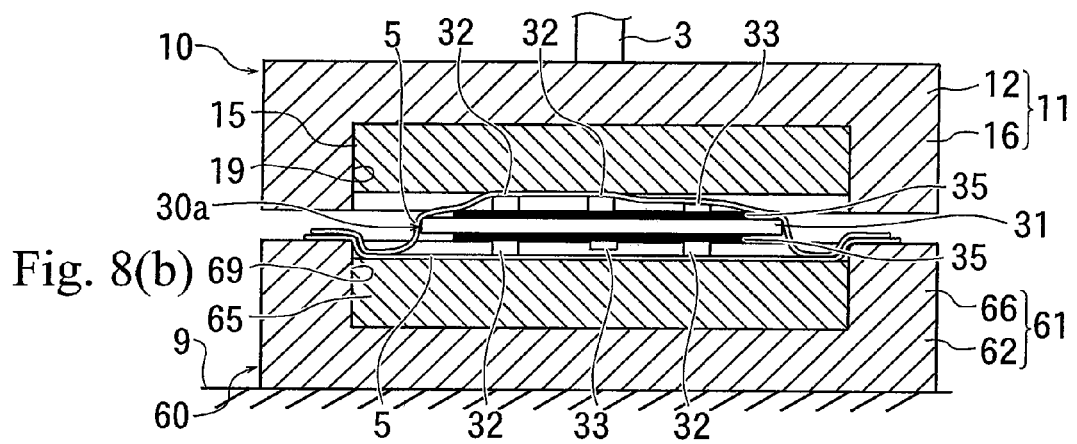
Figure 8C:
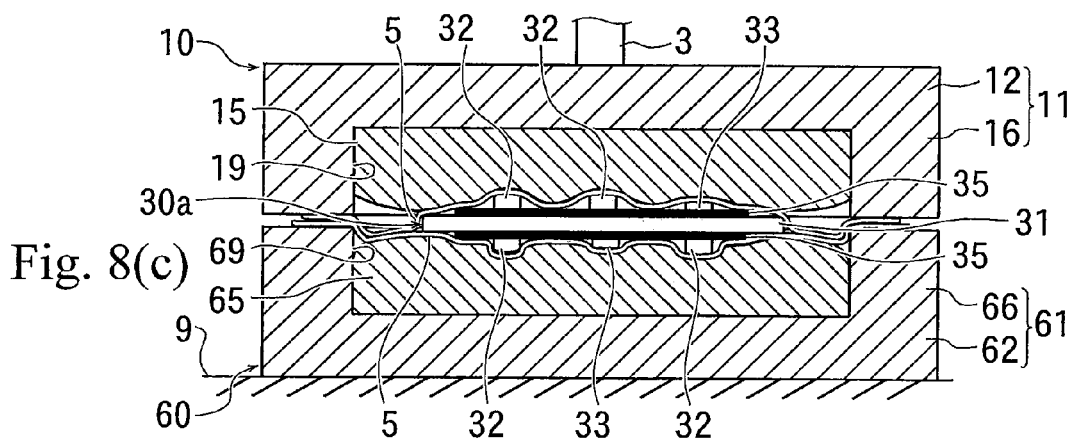

FIG. 8(b) shows a state in which the first pressing rubber 15 is in contact with the front face of the object 30 to be compression bonded through the protective film 5, that is, the state before the first and second pressing rubbers 15, 65 press the object 30 to be compression bonded. There is a gap between the tip of the first dam member 16 and that of the second dam member 66.

Assuming that the faces of the first and second head bodies 11, 61 to which the bottom faces of the first and second pressing rubbers 15, 65 are adhered are taken as first and second pressing plates 12, 62, the bottom faces of the first and second pressing rubbers 15, 65 are fixed to the first and second pressing plates 12, 62, whereas the side faces are not fixed to the first or second dam member 16, 66. Therefore, the central portions and the peripheral portions of the first and second pressing rubbers 15, 65 are made to be deformable.

Accordingly, similar to the first embodiment of the compression bonding device 1, when the first and second pressing rubbers 15, 25 approach relative to each other by descending the first pressing head 10, the first and second pressing rubbers 15, 65 are successively pressed to from the thicker electric components 32 to the thinner electric components 33, while those portions of the first and second pressing rubbers 15, 65 which are not in contact with the electric components 32, 33, swell to press the object 30 to be compression bonded.

The pressure of which the object 30 being to be pressed, is set depending upon the thicknesses of the anisotropic conductive films 35 and the electric components 32, 33 and the heating temperature of the anisotropic conductive films 35.

The sum of the depths of the above-mentioned first and second concave portions 17, 67 is set at a depth such that even when the first and second pressing rubbers 15, 65 are deformed on pressing the object 30 at a preset pressure, the tips of the first and second dam member 16, 66 are not brought into direct contact with each other. The first pressing head 10 continuously descends so long as the deformation of the first and second pressing rubbers 15, 65 continues. After the deformation of the first and second pressing rubbers 15, 65 stops, a force for descending the first pressing head 10 becomes a force for pressing the object 30 to be compression bonded (FIG. 8(c)).

Meanwhile, even when the edge portions of the protective films 5 run out of the openings 18, 68 and the tips of the first and second dam members 16, 66 are in contact with each other interposing the running-out protective films 5, if the protective films 5 are made of the compression deformable material as mentioned above, the object 30 to be compression bonded is kept pressed by the compression deformation of the protective films 5.

When the object 30 to be compression bonded is pressed, the surfaces of the first and second pressing rubbers 15, 65 swell. However, since the first and second pressing rubbers 15, 65 are surrounded by the first and second dam members 16, 66 of which tips of the first and second dam members 16, 66 are projected outwardly from the surfaces of the first and second pressing rubbers 15, 65, the swelled portions of the surfaces of the first and second pressing rubbers 15, 65 are dammed by the first and second dam members 16, 66. Therefore, in this compression bonding device 6, the surface of the first or second pressing rubber 15, 65 does not horizontally spread, so that the positional slip of the electric components 32, 33 do not occur.

Either one or both of the first and second pressing heads 10, 60 are provided with heating means. Similar to the first embodiment of the compression bonding device 1, when the object 30 to be compression bonded is pressed under heating, an electric device 30a is obtained, in which the electric components 32, 33 are electrically and mechanically connected to the substrate 31.

As mentioned above, explanation has been made of the case where the first and second concave portions 17, 67 are formed before the first and second pressing rubbers 15, 65 are in contact with the object 30 to be compression bonded. However, the present embodiment is not limited thereto.

Figure 9A:
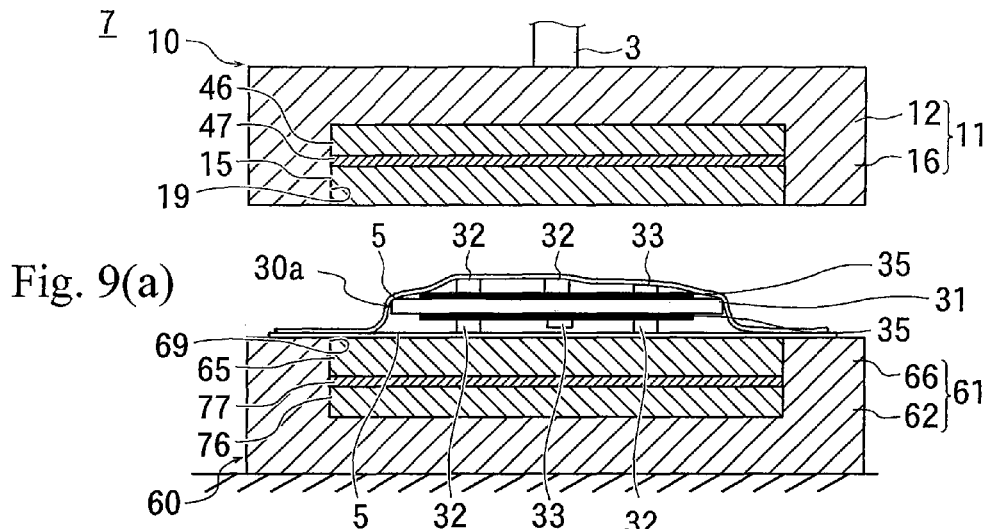
FIGS. 9(a) to 9(c) are sectional views showing steps for mounting electric components on a substrate by using a compression bonding device in a fourth embodiment.

In FIG. 9(a), a reference numeral 7 denotes a fourth embodiment of a compression bonding device. This compression bonding device 7 has the same structure as that of the above-mentioned third embodiment of the compression bonding device 6, except that first and second compression members 46, 76 are disposed between the first and second pressing plates 12, 62 and the first and second pressing rubbers 15, 65, respectively. The first and second pressing heads 10, 60 are arranged in the same manner as in the above third embodiment of the compression bonding device 6.

First and second compression members 46, 76 have the same constitution and arrangement as those of the first compression member 46 in the above-mentioned second embodiment of the compression bonding device 4. When an object 30 to be compression bonded is interposed between the first and second pressing rubbers 15, 65, the first and second compression members 46, 76 are compressed to reduce the film thickness before the first and second pressing rubbers 15, 65 are deformed. The first and second pressing rubbers 15, 65 are pressed toward the first and second pressing plates 12, 62, and move within the holes 19, 69 together with movable plates 47, 77, respectively.

Figure 9B:
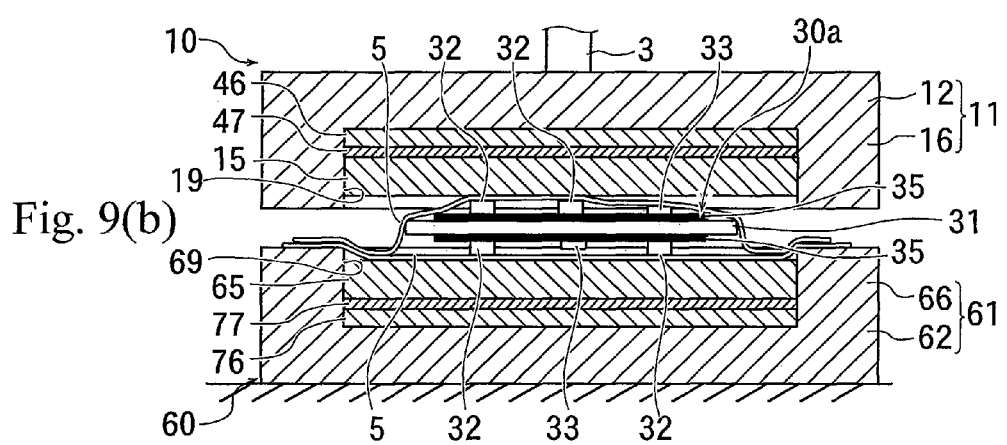
Figure 9C:
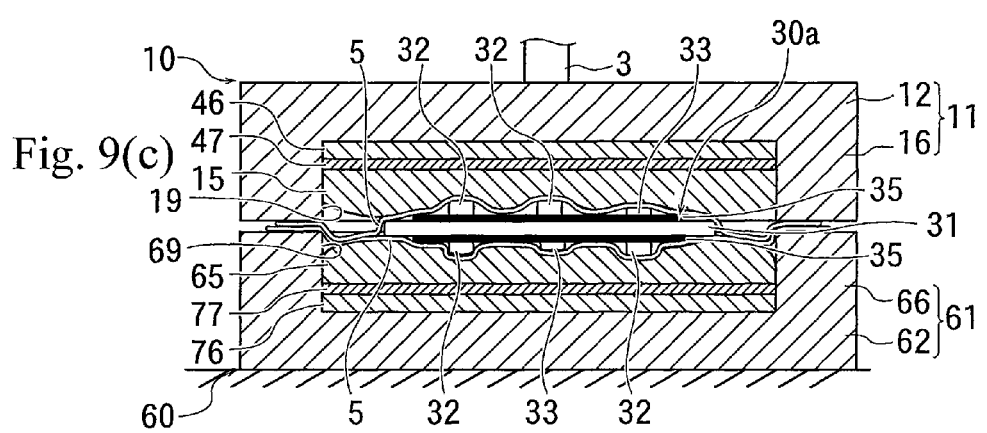

FIG. 9(b) shows a state that the thicknesses of the first and second compression members 46, 76 are reduced and the state before the first and second pressing rubbers 15, 65 deform. Even when no concave portion is formed before the object 30 to be compression bonded is sandwiched, concave portions which have surfaces of the first and second pressing rubbers 15, 65 as bottom faces and first and second dam members 16, 66 as side walls, are formed respectively, when the first and second pressing rubbers 15, 65 approach the first and second pressing plates 12, 62.

The sum of the depth of the concave portions at this time, that is, when the first and second compression members 46, 76 are compressed, the height from the surface of the first pressing rubber 15 to the tip of the first dam member 16 and the height from the front face of the second pressing rubber 65 to the tip of the second dam member 66 is made smaller than the thickness of the object 30 to be compression bonded including a protective film 5 on the surface of the second pressing rubber 65 and a protective film 5 on the front face of the object 30.

When the first and second compression members 46, 76 are compressed, the tips of the first and second dam members 16, 66 are not in contact with each other. Since nothing hinders the descending of the first pressing head 10, the first pressing head 10 is further descended to approach the first and second pressing rubbers 15, 65, so that those portions of the first and second pressing rubbers 15, 65 which are in contact with the electric components 32 are deformed, and all the electric components 32, 33 are finally pressed by the first and second pressing rubbers 15, 65.

The sum of the depths of the above-mentioned concave portions is set such that even when the electric components 32, 33 are pressed to the substrate 31, a predetermined pressure may be applied to the object 30 to be compression bonded, while the tips of the first and second dam members 16, 66 are not in contact with each other. Therefore, when pressing is continued, while the object 30 to be compression bonded is being heated, an electric device 30a in which the electric components 32, 33 are connected to the substrate 31 is obtained, as in the case using the above first embodiment of the compression bonding device 1.

When the electric components 32, 33 are pressed with the first and second pressing rubbers 15, 65, those portions of the first and second pressing rubbers 15, 65 which are not in contact with the electric components 32, 33, swell. However, since the concave portions are formed when the first and second electric components 32, 33 are pressed, as in the same with the third embodiment of the compression bonding device 6, the first or second pressing rubber 15, 65 does not spread horizontally through being dammed by the first or second dam member 16, 66. Therefore, when this compression bonding device 7 is used, an electric device 30a having high reliability is obtained without positional slip of the electric components 32, 33.

Figure 10A:
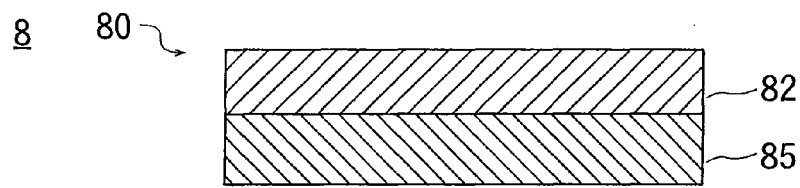
FIG. 10(a) is a sectional view showing a state in which a dam member is separated from first and second pressing rubbers.
Figure 10A:
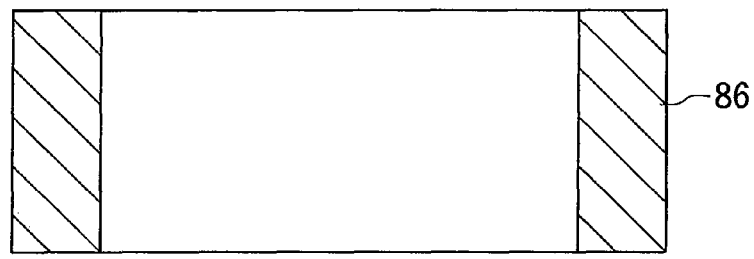
Figure 10A:
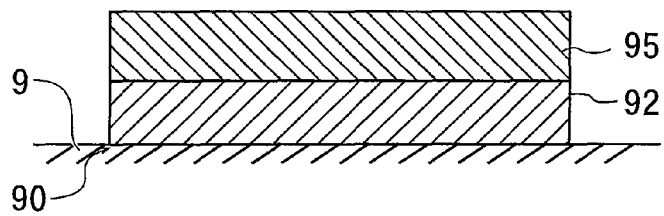
Figure 10B:
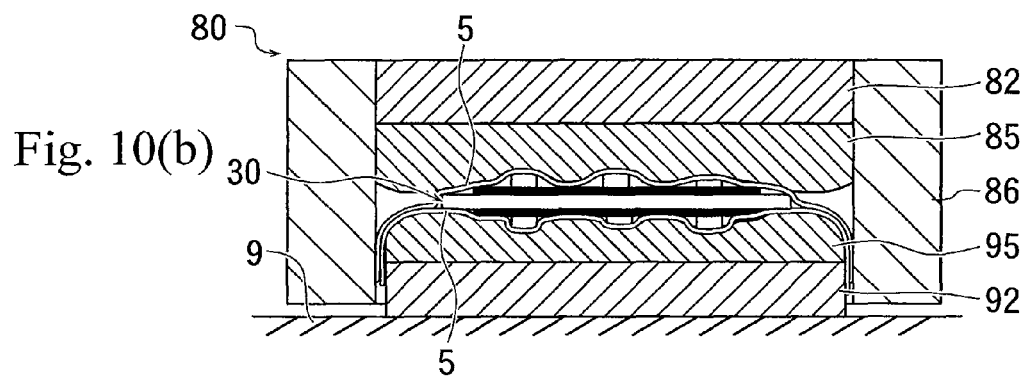
FIG. 10(b) is a sectional view showing a state in which a dam member surrounds the first and second pressing rubbers.

As mentioned above, explanation has been made of the case where either one or both of the first and second pressing rubbers 15, 25 are preliminarily surrounded by the dam members. However, the present embodiment is not limited thereto. In FIG. 10(a), a reference numeral 8 denotes a fifth embodiment of the compression bonding device. This compression bonding device 8 includes first and second pressing heads 80, 90 and a dam member 86.

The first and second pressing heads 80, 90 includes first and second metallic pressing plates 82, 92 and first and second pressing rubbers 85, 95 arranged on the surfaces of the first and second pressing plates 82, 92, respectively. Nothing is arranged around the first and second pressing rubbers 85, 95, and the side faces of the first and second pressing rubbers 85, 95 are exposed. The planar shapes of the surfaces of the first and second pressing rubbers 85, 95 are identical with or similar to each other.

Figure 11:
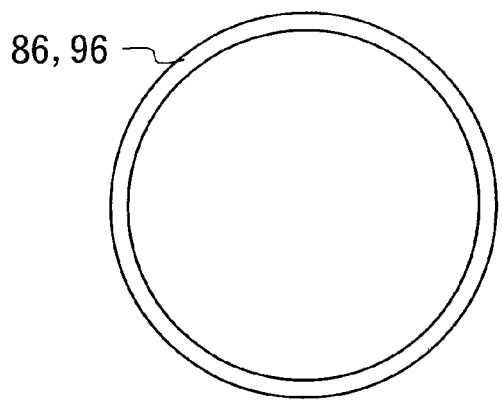
FIG. 11 is a plan view showing an example of a dam member.

As shown in FIG. 11, the dam member 86 is tubular shape, and the shapes of openings at the opposite ends of the tube are the same size as or greater than and similar shape to that of the surfaces of the first and second pressing rubbers 85, 95. Therefore, at least surface portions of the first and second pressing rubbers 85, 95 are insertable into the respective openings of the dam members 86.

Here, the side faces of the first and second pressing rubbers 85, 95 are made almost vertical to the surfaces thereof, and the shapes of the planes of the first and second pressing rubbers 85, 95 cut in parallel to its surfaces are substantially equal from the front face to the rear face.

The dam member 86 has an inner wall face substantially vertical to the openings at the opposite ends, and the sectional shape of the dam member as cut in parallel to these openings is substantially equal from one end to the other, so that not only the surface portions but also the side faces of the first and second pressing rubbers 85, 95 are insertable into the dam member 86.

The first pressing head 80 is arranged such that the face at which the first pressing rubber 85 is disposed is directed downwardly. A working table 9 is arranged below the first pressing head 80, and the second pressing head 90 is disposed on the working table 9 such that the face on a side at which the second pressing rubber 95 is arranged is directed upwardly.

The first pressing rubber 85 is inserted into the tube through one end of the dam member 86 by a carrier means not shown, thereby fitting the dam member 86 to the first pressing plate 82. In this state, the periphery of the first pressing rubber 85 is surrounded by the dam member 86, and the other end of the dam member 86 is projected downwardly from the surface of the first pressing rubber 85.

A protective film 5 is placed on the front face of the second pressing rubber 95, an object 30 to be compression bonded is arranged on this protective film 5, and then a protective film 5 is placed over the object 30 to be compression bonded.

After the second pressing rubber 95 is aligned to be positioned inside the opening at the lower end of the dam member 86, the dam member 86 is descended together with the first pressing head 80, so that the object 30 to be compression bonded is inserted into the dam member 86, and the first pressing rubber 85 is in contact with the object 30 to be compression bonded, through the protective film 5.

The length of the tube of the dam member 86 is set such that its lower end is flush with or projected downwardly from the surface of the second pressing rubber 95 in the state when the first pressing rubber 85 is in contact with the object 30 to be compression bonded and before the first and second pressing rubbers 85, 95 are deformed. Similar to the case of the first embodiment of the compression bonding device 1 mentioned above, when the object 30 to be compression bonded is pressed, the first or second pressing rubber 85, 95 is not spread horizontally, so that the positional slip of the electric components 32, 33 hardly occurs.

Figure 12:
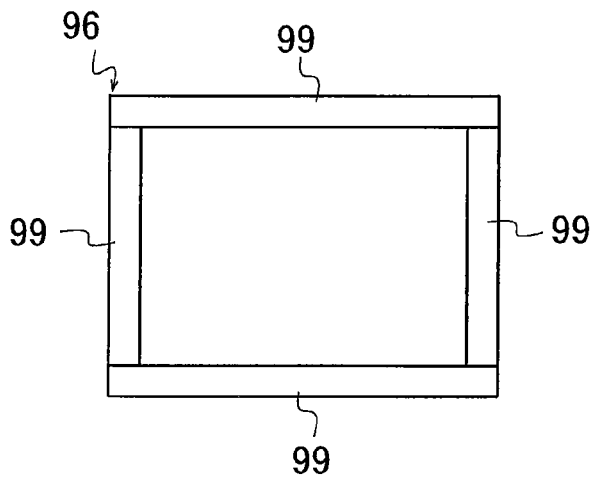
FIG. 12 is a plan view showing another example of the dam member.

As mentioned above, explanation has been made of the case where the dam member 86 is an integrally formed tubular shape, but the embodiment is not limited thereto. In FIG. 12, a reference numeral 96 denotes another example of the dam member. This dam member 96 comprises a plurality of planar wall members 99. A single tube is formed by arranging the wall members 99 along the side faces of the first pressing rubber 85 and attaching the wall members to the first pressing plate 82 with the use of a moving unit not shown in the state that the surfaces of each wall member 99 are directed vertically. Thus, the single cylinder is formed to surround the periphery of the first pressing rubber 85.

In this state, the lower end of each of the wall members 99 is projected downwardly from the surface of the first pressing rubber 85, so that the lower end of the tube surrounding the periphery of the first pressing rubber 85 is projected downwardly from the surface of the first pressing rubber 85, and the object 30 to be compression bonded and the second pressing rubber 95 are insertable into that portion of the tube which is projected downwardly.

As mentioned above, explanation has been made of the case where the first pressing rubber 85 is surrounded by the dam member 86, 96, and the second pressing rubber 95 is inserted into the lower end thereof. However, the embodiment is not limited thereto.

It may be that a dam member 86, 96 is attached to the second pressing head 90 such that the tip may project upwardly from the front face of the second pressing rubber 95 so as to firstly surround the periphery of the second pressing rubber 95 by a dam member 86, 96, and the first pressing rubber 85 is inserted into the dam member 86, 96 through the opening of the dam member 86, 96 projecting upwardly.

As mentioned above, explanation has been made of the case where the dam member 86, 96 is attached to either one of the first and second pressing heads 80, 90. However, the embodiment is not limited thereto. It may be that the dam member 86, 96 are not attached to either the first or second pressing head 80, 90, the first and second pressing rubbers 85, 95 are in contact with the object 30 to be compression bonded and then the peripheries of the first and second pressing rubbers 85, 95 are surrounded by the dam member 86, 96 until the object 30 begins to be pressed.

Further, it may be that the dam members 86, 96 are attached to the first and second pressing heads 80, 90, respectively, the peripheries of the first and second pressing rubbers 85, 95 are surrounded by the dam members 86, 96, respectively, and then, the object 30 to be compression bonded is pressed. In this case, the construction and the arrangement of the first and second pressing heads 80, 90 in the state that the dam members 86, 96 are attached thereto are preferably identical with those of the first and second pressing heads 10, 60 in the above third embodiment of the compression bonding device 6.

The tube lengths of the dam members 86, 96 or the arrangement of the dam members 86, 96 are not particularly limited. So long as the dam members surround at least the portions of the surfaces of the first and second pressing rubbers 85, 95 when the object 30 to be compression bonded is to be pressed, they may surround the entire portions of the first and second pressing rubbers 85, 95 from the surfaces to the back surfaces, or they may surround not only the first and second pressing rubbers 85, 95 but also the first and second pressing plates 82, 92.

Furthermore, in the above fifth embodiment of the compression bonding device 8, the first and second pressing rubbers 85, 95 may be attached directly to the first and second pressing plates 82, 92. Alternatively, as in the fourth embodiment of the compression bonding device 7, compression members may be provided between the first and second pressing plates 82, 92 and the first and second pressing rubbers 85, 95, respectively.

The protective films 5 may be arranged on the surfaces of the first and second pressing rubbers 85, 95 before the peripheries of the first and second pressing rubbers 85, 95 are surrounded by the first and second dam members 86, 96. Alternatively, they may be arranged on the surfaces of the first and second pressing rubbers 85, 95 after the peripheries of the first and second pressing rubbers 85, 95 are surrounded by the first and second dam members 86, 96.

Figure 13:
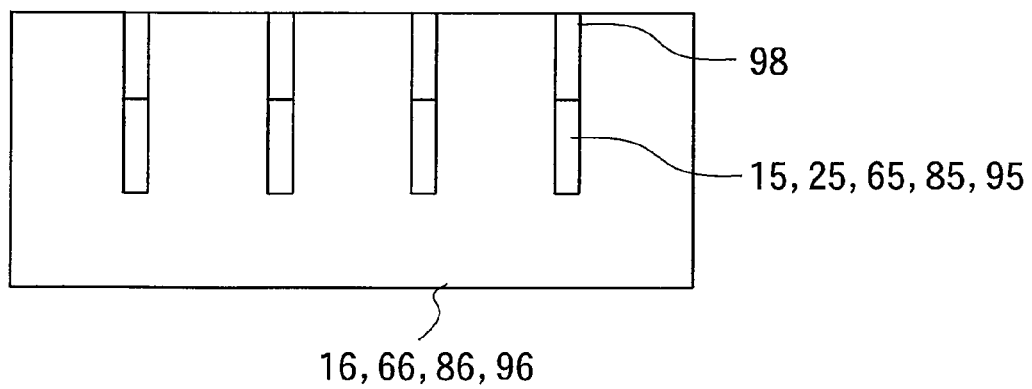
FIG. 13 is a side view showing a state in which notches are formed in the dam member.
Figure 14A:
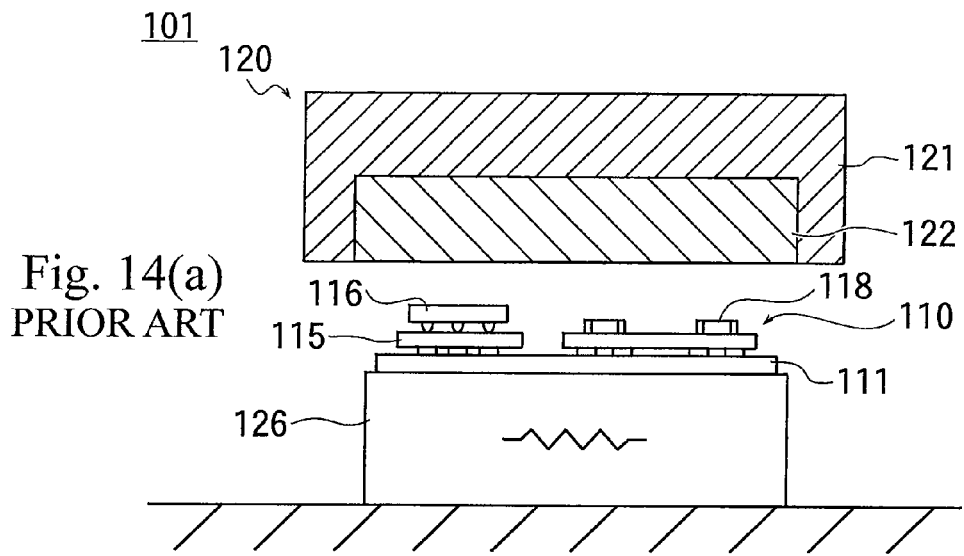
FIG. 14(a) and FIG. 14(b) are sectional views showing the conventional mounting method.
Figure 14B:
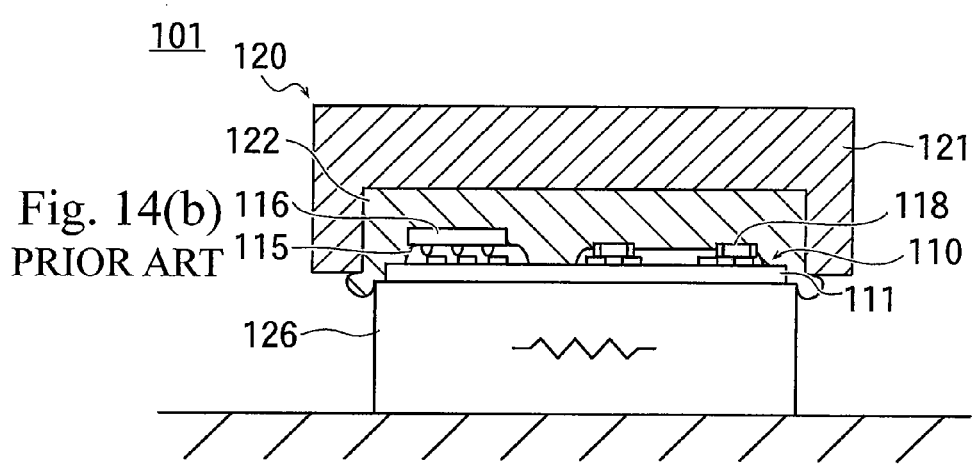
Figure 15:
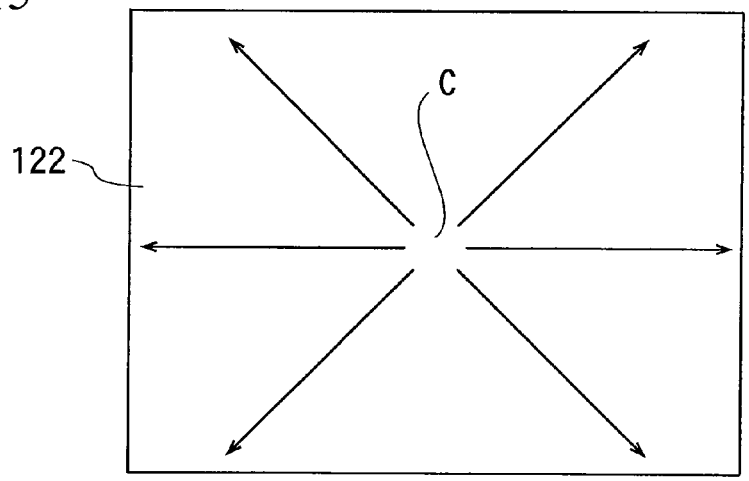
FIG. 15 is a plan view showing spreading of the pressing rubber.

As mentioned above, explanation has been made of the case where the entire peripheries of the first and second pressing rubbers 15, 65, 85, 95 are surrounded by the first and second dam members 16, 66, 86, 96. However, the embodiment is not limited thereto. So long as the first and second pressing rubbers 15, 25, 65, 85, 95 can be prevented from spreading horizontally, as shown in FIG. 13, either one or both of the first and second dam members 16, 66, 86, 96 may be formed with slits 98 to expose a part of the side faces of the first and second pressing rubbers 15, 25, 65, 85, 95.

The shape or the size of the protective film 5 is not particularly limited. So long as be in contact between the anisotropic conductive films 35 and the first and second pressing rubbers 15, 25, 65, 85, 95 can be avoided, the protective films 5 having such a size as not protruding outside the surfaces of the first and second pressing rubbers 15, 25, 65, 85, 95 may be used, or the protective films 5 covering only a part of the surface of the object 30 to be compression bonded may be used.

When the adhesion is low between the anisotropic conductive film 35 and the first and second pressing rubbers 15, 25, 65, 85, 95 as used, the first and second pressing rubbers 15, 25, 65, 85, 95 may be in contact with directly with the object 30 to be compression bonded, without using the protective film 5.

As a method for lowering the adhesion between the first and second pressing rubbers 15, 25, 65, 85, 95 and the anisotropic conductive films 35, there is an approach in which the constituting material of the first and second pressing rubbers 15, 25, 65, 85, 95 is changed to a material having lower adhesion to the anisotropic conductive film 35 or an approach in which releasable layers having releasability from the anisotropic conductive films 35 are formed on the surfaces of the first and second pressing rubbers 15, 25, 65, 85, 95.

The location for providing the heating means is not particularly limited, and the heating means may be provided for either one or both of the first and second pressing heads, or the heating means may be provided in the working table 9, if the heat conductivity is ensured. The kind of the substrate 31 to be used in the present embodiment is not limited, and a variety of a rigid substrate, a flexible substrate and the like can be used.

Either one or both of the thermoplastic resin and the thermosetting resin may be included into the anisotropic conductive film 35.

The kinds of the thermosetting resin and the thermoplastic resin are not particularly limited. As the thermosetting resin, one or more kinds of an epoxy resin, an acrylic resin, an urethane resin and the like may be used. As the thermoplastic resin, one or more kinds of a phenoxy resin, a polyvinyl alcohol resin and the like may be used, for example.

The kind of the conductive particles is not particularly limited, and resin particles having metallic layers formed thereon may be used in addition to the metallic particles. Moreover, it may be that after a pasty anisotropic conductive adhesive is applied onto the surfaces of the substrate 31 instead of the anisotropic conductive film 35, and the compression bonded object 30 to be compression bonded is obtained by adhering the electric components to the anisotropic conductive adhesive.

Furthermore, an adhesive containing no electroconductive particles may be used, instead of the anisotropic conductive film 35 or the anisotropic conductive adhesive, depending upon the mounting condition of the electric components 32, 33.

The kind of the protective film is not particularly limited, and a protective film releasable from the above-mentioned anisotropic conductive film 35 is preferred. For example, a protective film obtained by forming a film of a polytetrafluoroethylene or a protective film obtained by forming a film of a silicone rubber may be used.

The elastic material constituting the first and second pressing rubbers is not particularly limited, and when one example is mentioned, an elastomer having a rubber hardness (according to JIS S6050) of 40 or 80 could be used.

The rubber hardness is measured according to a method described in "6. Test method" of JIS S6050:2002. The contents thereof are given below.

As a material to be used in the test, one having passed 24 hours or more after the production is used. Meanwhile, the general items common in the chemical analyses are as given JIS K0050. The hardness test is conducted such that a hardness tester is used, a push needle of the tester is set vertically, a pressing face is in contact with a surface of a test piece held horizontally, and a scale is immediately read in a plus quantity. In this case, the entire surface of the measuring place of the test piece is divided into three equal portions, their central portions are measured one by one, and a central value among the measured ones is taken as the hardness of the test piece.

The hardness tester is a spring hardness tester in which the shape of the push needle is of a hemisphere in a diameter of 5.08 mm±0.02 mm. The height of the push needle is 2.54±0.22 mm with a scale of 0, and 0 mm with a scale of 100. The relationship between the scale and the spring force is given in the following table 1.

TABLE 1

| Relationship between the scale and the spring force | | | | | | | | | | | | | |
|---|---|---|---|---|---|---|---|---|---|---|---|---|---|
| Scale | 0 | 10 | 20 | 25 | 30 | 40 | 50 | 60 | 70 | 75 | 80 | 90 | 100 |
| Spring force N | 0.54 | 1.32 | 2.11 | 2.50 | 2.89 | 3.68 | 4.46 | 5.25 | 6.03 | 6.42 | 6.82 | 7.60 | 8.39 |

With respect to elastomers having rubber hardnesses of 40, 60, 80, respectively, rubber hardnesses were measured every 30° C. in a measuring temperature range of 30° C. to 240° C., and measured changes in rubber hardnesses were ±2. Since this value can be said to be within a measurement error range, it is found that the rubber hardness is a value not affected by temperature changes.

As the elastomer to be used for the first and second pressing rubbers, both natural rubber and a synthetic rubber may be used, and a silicone rubber is preferably used from the standpoint of heat resistance and pressure proof. The first and second pressing rubbers may be of the same rubber hardness by constituting them to be the same material, or they may be of different rubber hardnesses by constituting them to be of different materials.

The kinds of the electric components 32, 33 to be connected to the substrate 31 are not particularly limited. Specifically, substrate such as, semiconductor elements, resistance elements, etc. are recited.

Before the electric components 32, 33 is connected to the front face and the rear face of the substrate 31, or during when the electric components 32, 33 begin to be connected to the rear face of the substrate 31 after the electric components 32, 33 are connected to the front face, or after the electric components 32, 33 are connected to the front face and the rear face of the substrate 31, other electric component such as a CR component may be connected to either one or both of the front face and the rear face of the substrate 31.

As mentioned above, explanation has been made of the case where plural kinds of the electric components 32, 33 having respectively different thicknesses are connected to the front face and the rear face of the substrate 31. However, the present embodiments are not limited thereto. The present embodiments encompass a case where electric components having the same thicknesses are connected to the front face and the rear face of the substrate 31, and a case where the electric component or components are connected to either the front face or the rear face of the substrate 31.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention is claimed as follows:

1. An electric component mounting method for electrically connecting a electric component and a substrate using a compression bonding device having a first and a second pressing plate and a first and a second pressing rubbers placed on the first and second pressing plates, respectively, the method comprising the steps of:

arranging an object to be compression bonded of which electric components are disposed on a front face and rear face of a substrate, between the first and second pressing rubbers; and disposing the electric components by adhesion force of anisotropic conductive films arranged on the front face and rear face of the substrate, arranging protective films releasable from the anisotropic conductive films between the first pressing rubber and the object to be compression bonded, and between the second pressing rubber and the object to be compression bonded, heating the anisotropic conductive films so as to increase the flowability of the anisotropic conductive film, then, pressing the electric components with the first and second pressing rubbers in order to fix each of the electric components onto the substrate in a state that a compression member made of a material possessing voids therein like a spongy-rubber is arranged between the first pressing rubber made of an elastic material having internal uniform property and the first pressing plate, wherein a volume of the compression member decreases during the pressing of the electric components with the first and the second pressing rubbers.

2. The electric component mounting method of claim 1, wherein the object to be compression bonded is pressed with the first and second pressing rubbers in the state that a moveable plate is arranged between the first pressing rubber and the compression member.

3. The electric component mounting method of claim 1, wherein the object to be compression bonded is pressed with the first and second pressing rubbers in the state that a dam member is located at position higher than surfaces of peripheries of the first and second pressing rubbers, and the side faces of the first and second pressing rubbers deformed are dammed by the pressing with the dam member.

4. The electric component mounting method of claim 3, wherein the object to be compression bonded is pressed with the first and second pressing rubbers in the state that the first pressing rubber and the compression member contact the dam member without being fixed to the dam member.

* * * * *